(12) United States Patent
Bazizi et al.

(10) Patent No.: US 8,994,107 B2
(45) Date of Patent: Mar. 31, 2015

(54) SEMICONDUCTOR DEVICES AND METHODS OF FORMING THE SEMICONDUCTOR DEVICES INCLUDING A RETROGRADE WELL

(75) Inventors: El Mehdi Bazizi, Dresden (DE); Francis Benistant, Singapore (SG)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 50 days.

(21) Appl. No.: 13/595,208

(22) Filed: Aug. 27, 2012

(65) Prior Publication Data

US 2014/0054649 A1   Feb. 27, 2014

(51) Int. Cl.
*H01L 29/78* (2006.01)
*H01L 29/10* (2006.01)
*H01L 29/66* (2006.01)

(52) U.S. Cl.
CPC .......... *H01L 29/6659* (2013.01); *H01L 29/105* (2013.01); *H01L 29/1054* (2013.01); *H01L 29/7836* (2013.01)
USPC .... 257/345; 257/344; 257/346; 257/E29.266; 257/E29.269; 438/289; 438/291; 438/299; 438/301; 438/302

(58) Field of Classification Search
None
See application file for complete search history.

(56) References Cited

U.S. PATENT DOCUMENTS

| | | | |
|---|---|---|---|
| 6,818,938 B1 * | 11/2004 | Naem | 257/302 |
| 6,927,137 B2 | 8/2005 | Chakravarthi et al. | |
| 7,199,430 B2 | 4/2007 | Babcock et al. | |
| 8,569,156 B1 * | 10/2013 | Scudder et al. | 438/527 |
| 2009/0302388 A1 | 12/2009 | Cai et al. | |

OTHER PUBLICATIONS

Archived version of wikipedia.org/wiki/Doping_(semiconductor).*
Seiki et al. Design and Characteristics of the Lightly Doped Drain-Souce (LDD) Insulated Gate Field-Effect Transistor. Aug. 1980. IEEE Journal of Solid-State Circuits, vol. SC-15, No. 4, pp. 424-432.*
Sedra/Smith. Microelectronic circuits. 2004. Oxford University Press. Sections 4.1.3, 4.1.7, 4.1.8.*
N.E.B. Cowern, Diffusion Suppression in Silicon by Substitutional C Doping, Publication Article, 32th European Solid-State Device Research Conference, Sep. 24-26, 2002.

* cited by examiner

*Primary Examiner* — Zandra Smith
*Assistant Examiner* — Molly Reida
(74) *Attorney, Agent, or Firm* — Ingrassia Fisher & Lorenz, P.C.

(57) ABSTRACT

Semiconductor devices and methods of forming semiconductor devices are provided herein. In an embodiment, a semiconductor device includes a semiconductor substrate. A source region and a drain region are disposed in the semiconductor substrate. A channel region is defined in the semiconductor substrate between the source region and the drain region. A gate dielectric layer overlies the channel region of the semiconductor substrate, and a gate electrode overlies the gate dielectric layer. The channel region includes a first carbon-containing layer, a doped layer overlying the first carbon-containing layer, a second carbon-containing layer overlying the doped layer, and an intrinsic semiconductor layer overlying the second carbon-containing layer. The doped layer includes a dopant that is different than carbon.

11 Claims, 4 Drawing Sheets

SEMICONDUCTOR DEVICES AND METHODS OF FORMING THE SEMICONDUCTOR DEVICES INCLUDING A RETROGRADE WELL

TECHNICAL FIELD

The technical field generally relates to semiconductor devices and methods of forming the semiconductor devices including a semiconductor substrate having a retrograde well. More particularly, the technical field relates to semiconductor devices and methods of forming the semiconductor devices with a transistor formed on a semiconductor substrate, with the semiconductor substrate having a retrograde well disposed therein.

BACKGROUND

As advanced complementary metal-oxide-semiconductor (CMOS) technology continues to scale and move into the deep-sub-micron geometry dimensions, the optimization of channel profile and source/drain regions has become complex. A desire to provide high saturation currents and low off-currents calls for a low subthreshold swing and high channel mobility, while suppressing short channel effects calls for high channel doping. Conventional channel doping profiles are insufficient to provide for low voltage threshold and acceptable short channel behavior as the scale of advanced CMOS technology decreases.

Super steep retrograde wells (SSRWs) have been developed, in which a dopant concentration in areas of the channel region further from a gate dielectric of the transistor is higher than dopant concentration in areas that are adjacent to the gate dielectric. The SSRWs effectively suppress short channel effects while maintaining a low subthreshold swing and a low voltage threshold. However, a concentration gradient of dopants in the SSRWs is typically limited by diffusion characteristics of the dopant in the channel region. One difficulty associated with forming the SSRWs is due to diffusion of the dopant in the SSRW through the channel region toward, and possibly into, the gate dielectric and gate electrode. One technique that has been developed to address diffusion of the dopant in the SSRW through the channel region is formation of a doped layer within a semiconductor substrate with a carbon-doped silicon layer disposed in the channel region between the doped layer and the gate dielectric. The carbon in the carbon-doped silicon suppresses interstitial diffusion, such as diffusion of dopant from the doped layer through the carbon-doped silicon layer, thereby effectively blocking diffusion of common dopants (such as boron in p-well configurations) in the channel region toward the gate dielectric. However, the capacity of the carbon-doped silicon layer to suppress interstitial diffusion can become depleted in the carbon-doped silicon layer during source/drain region formation, which generally introduces interstitials into the channel region from the source region and the drain region and thereby degrades the effectiveness of the carbon-doped silicon layer to suppress interstitial diffusion from the SSRW toward the gate dielectric.

Accordingly, it is desirable to provide semiconductor devices and methods of forming semiconductor devices including SSRW configurations in a channel region between a source region and a drain region, with enhanced suppression of interstitial dopant diffusion in the channel region toward a gate dielectric. Furthermore, other desirable features and characteristics of the present invention will become apparent from the subsequent detailed description of the invention and the appended claims, taken in conjunction with the accompanying drawings and this background of the invention.

BRIEF SUMMARY

Semiconductor devices and methods of forming semiconductor devices are provided herein. In an embodiment, a semiconductor device includes a semiconductor substrate. A source region and a drain region are disposed in the semiconductor substrate. A channel region is defined in the semiconductor substrate between the source region and the drain region. A gate dielectric layer overlies the channel region of the semiconductor substrate, and a gate electrode overlies the gate dielectric layer. The channel region includes a first carbon-containing layer, a doped layer overlying the first carbon-containing layer, a second carbon-containing layer overlying the doped layer, and an intrinsic semiconductor layer overlying the second carbon-containing layer. The doped layer includes a dopant that is different than carbon.

In another embodiment, a semiconductor device includes a semiconductor substrate. A source region and a drain region are disposed in the semiconductor substrate. A channel region is defined in the semiconductor substrate between the source region and the drain region. A gate dielectric layer overlies the channel region of the semiconductor substrate, and a gate electrode overlies the gate dielectric layer. An extension region is disposed adjacent to each source region and drain region in the semiconductor substrate. The extension regions extend toward the channel region from the respective source region and the drain region, and the extension regions extend under a portion of the gate electrode. The channel region includes a first carbon-containing layer, a doped layer disposed directly on the first carbon-containing layer, a second carbon-containing layer directly disposed on the doped layer, and an intrinsic semiconductor layer directly disposed on the second carbon-containing layer. The doped layer includes a dopant that is different than carbon. At least one of the first carbon-containing layer, the doped layer, the second carbon-containing layer, or the intrinsic semiconductor layer is further defined as an epitaxially-grown layer.

In another embodiment, a method of forming a semiconductor device includes providing a semiconductor wafer that includes a first semiconductor material. A first carbon-containing layer is formed over the surface of the semiconductor wafer. A doped layer is formed overlying the first carbon-containing layer, with the doped layer including a dopant that is different than carbon. A second carbon-containing layer is formed overlying the doped layer. An intrinsic semiconductor layer is formed overlying the second carbon-containing layer to produce a semiconductor substrate. A transistor is formed on the semiconductor substrate. The transistor includes a gate dielectric layer overlying the intrinsic semiconductor layer, a gate electrode overlying the gate dielectric layer, and a source region and a drain region that are disposed in the semiconductor substrate.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
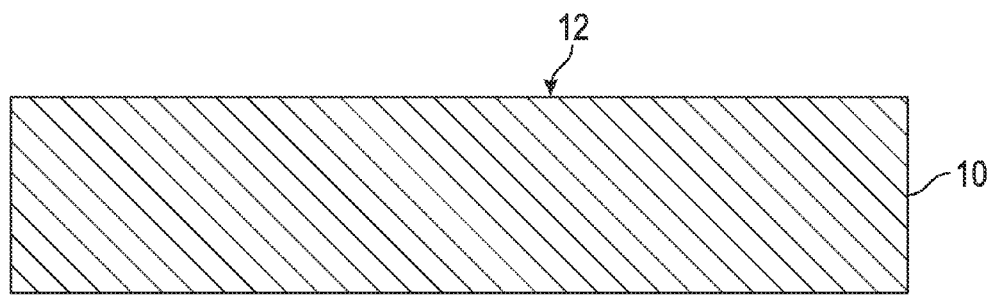
FIG. 1 is a schematic cross-sectional side view of a portion of a semiconductor wafer in accordance with an embodiment.

The following detailed description is merely exemplary in nature and is not intended to limit the invention or the application and uses of the invention. Furthermore, there is no intention to be bound by any theory presented in the preceding background or the following detailed description.

Semiconductor devices and methods of forming semiconductor devices are provided herein in which a super steep retrograde well (SSRW) configuration is formed in a channel region of the semiconductor device. In particular, the semiconductor devices include a semiconductor substrate, a source and drain region disposed in the semiconductor substrate, the channel region defined between the source region and the drain region in the semiconductor substrate, a gate dielectric layer overlying the channel region, and a gate electrode overlying the gate dielectric layer. The channel region has a dopant concentration in areas of the channel region that are further from the gate dielectric layer that are higher than dopant concentration in areas that are adjacent to the gate dielectric, thereby providing the SSRW configuration. In particular, the channel region includes a first carbon-containing layer, a doped layer that overlies the first carbon-containing layer, a second carbon-containing layer that overlies the doped layer, and an intrinsic semiconductor layer that overlies the second carbon-containing layer. The doped layer includes a dopant different than carbon, and the dopant may be a p-type or n-type dopant, depending upon whether the source region and the drain region contain p-type or n-type dopants.

Without being bound by any particular theory, it is believed that during formation of the source region and the drain region, medium to high dose ion implantation used to form the source region and the drain region (or extension regions as described in further detail below) has a tendency to introduce excessive interstitials into the channel region and, in particular, the intrinsic semiconductor layer. High dose ion implantation associated with forming the extension regions results in introduction of particularly high amounts of interstitials into the channel region, often resulting in a "halo" region that extends into the channel region beyond the intended extension region. Carbon is a fast interstitial-mediated diffuser and acts as a chemical pump to expel a flux of interstitial atoms from the second carbon-containing layer, thereby creating a localized undersaturation of interstitials. With the undersaturation of interstitials in the second carbon-containing layer, the second carbon-containing layer suppresses dopant diffusion from the doped layer in the channel region into the intrinsic semiconductor layer, toward the gate dielectric layer. However, the effectiveness of the second carbon-containing layer in suppressing interstitials from the ion implantation is limited due to saturation from suppressing dopant diffusion from the doped layer. The first carbon-containing layer functions as an additional interstitial chemical pump to provide additional localized undersaturation of interstitials, thereby enhancing suppression of interstitial introduction from the ion implantation into the channel region and, ultimately, suppressing flow of interstitials and dopant from the doped layer into the intrinsic semiconductor layer beyond what can be accomplished with the second carbon-containing layer alone.

An exemplary method of forming a semiconductor device will now be described with reference to FIGS. 1-8. Referring to FIG. 1, a semiconductor wafer 10 including a first semiconductor material is provided. The first semiconductor material may be any semiconductor material that is known for industrial use in electronic devices. Examples of the first semiconductor material include, but are not limited to, those chosen from silicon, silicon germanium (SiGe), germanium (Ge), gallium arsenide (GaAs), or indium phosphide (InP). For example, in an embodiment, when the first semiconductor material is silicon, the silicon is present in an amount of from about 95 to about 100 mol %, such as from about 99 to about 100 mol %, based upon the total amount of atoms in the semiconductor wafer 10. The silicon may be substantially pure, i.e., dopants and/or impurities are present in amounts of less than or equal to 1 mol % based upon the total amount of atoms in the semiconductor wafer 10 and are desirably absent from the semiconductor wafer 10. In an embodiment, the semiconductor wafer 10 is further defined as a silicon-on-insulator (SOI) wafer and has a thickness of from about 50 to about 1500 nm, such as from about 50 to about 300 nm. In another embodiment, the semiconductor wafer 10 is further defined as a bulk silicon wafer and has a thickness of up to 1 mm, such as from about 500 to about 750 μm.

Figure 2:
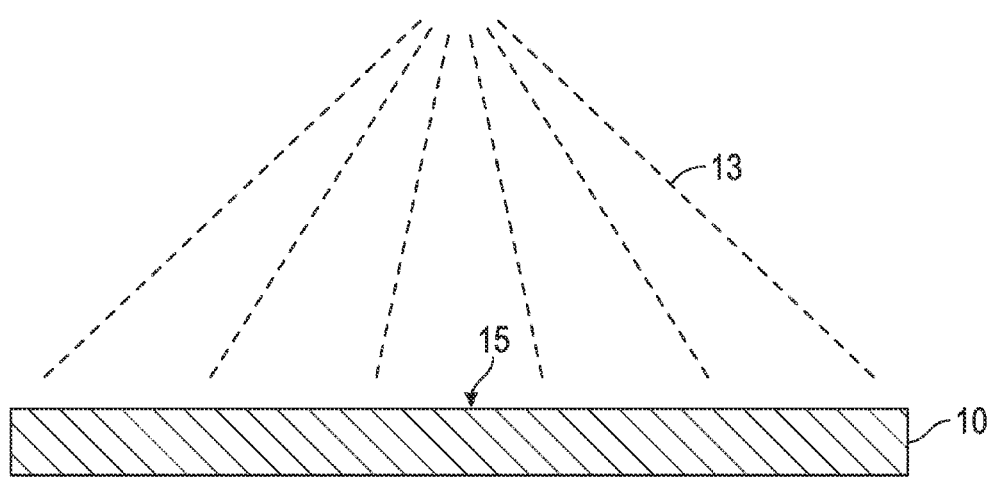
FIG. 2 is a schematic cross-sectional side view of the portion of a semiconductor wafer of FIG. 1 with a surface of the semiconductor wafer etched to a desired depth.

Referring to FIGS. 1 and 2, the exemplary process continues with etching a surface 12 of the semiconductor wafer 10 in anticipation of forming a SSRW 14 for a transistor 16 in the semiconductor device as described in further detail below. The surface 12 of the semiconductor wafer 10 is blanket etched to a desired depth using an appropriate etchant 13. For example, in an embodiment, the semiconductor wafer 10 may be etched using anisotropic plasma etching techniques that are known in the art. In another embodiment, the SSRW 14 is formed directly upon the surface 12 of the semiconductor wafer 10 without first etching the surface 12 of the semiconductor wafer 10.

Figure 3:
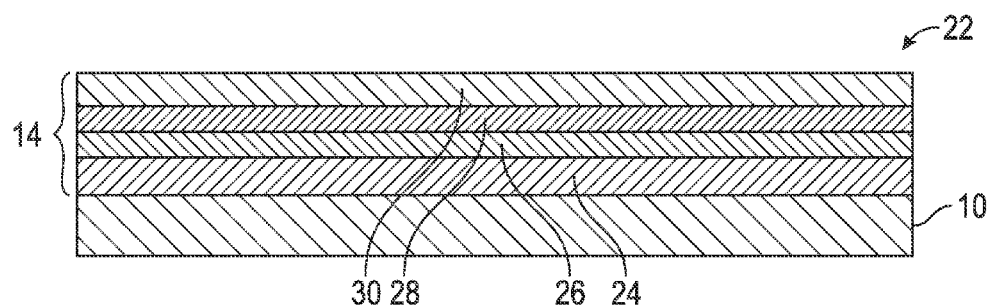
FIG. 3 is a schematic cross-sectional side view of the portion of a semiconductor wafer of FIG. 2 with a first carbon-containing layer formed over the etched surface of the semiconductor wafer, a doped layer formed overlying the first carbon-containing layer, a second carbon-containing layer formed overlying the doped layer, and an intrinsic semiconductor layer formed overlying the second carbon-containing layer to form a semiconductor substrate.

In an embodiment, the SSRW 14 is then formed over the surface of the semiconductor wafer 10 to produce a semiconductor substrate 22 in anticipation of transistor formation. In particular, as shown in FIG. 3, a first carbon-containing layer 24 is formed over the surface of the semiconductor wafer, such as over the etched surface 15, a doped layer 26 is formed overlying the first carbon-containing layer 24, a second carbon-containing layer 28 is formed overlying the doped layer 26, and an intrinsic semiconductor layer 30 is formed overlying the second carbon-containing layer 28. In an embodiment and as shown in FIG. 3, the doped layer 26 is directly disposed on the first carbon-containing layer 24, the second carbon-containing layer 28 is disposed directly on the doped layer 26, and the intrinsic semiconductor layer 30 is disposed directly on the second carbon-containing layer 28. However, it is to be appreciated that in other embodiments, intervening layers (not shown) may be disposed between the first carbon-containing layer 24, the doped layer 26, the second carbon-containing layer 28, and/or the intrinsic semiconductor layer 30. In an embodiment and as shown in FIG. 3, at least one of the first carbon-containing layer 24, the doped layer 26, the second carbon-containing layer 28, or the intrinsic semiconductor layer 30 is epitaxially formed over the etched surface 15 of the semiconductor wafer 10. In embodiments, each of the first carbon-containing layer 24, the doped layer 26, the second carbon-containing layer 28, and the intrinsic semiconductor layer 30 are epitaxially formed over the etched surface 15 of the semiconductor wafer 10. In other embodiments (not shown), one or more of the aforementioned layers 24, 26, 28, 30 may be formed by deposition of semiconductor material followed by ion implantation, or may be formed by another deposition technique.

In an embodiment, the first carbon-containing layer 24 includes carbon-doped semiconductor material, and the semiconductor material may be any of those that are set forth above as suitable for the first semiconductor material. In an embodiment, the carbon-doped semiconductor material is carbon-doped silicon. As set forth above, the first carbon-containing layer 24 functions as an additional interstitial chemical pump to provide additional localized undersaturation of interstitials to supplement the contribution from the second carbon-containing layer 28, thereby enhancing suppression of interstitial introduction into a channel region 32 from subsequent ion implantation that is employed to form a source region 34, a drain region 36, or extension regions 38 for the source region 34 and the drain region 36 as described in further detail below. In an embodiment, the first carbon-containing layer 24 has a carbon concentration of about 5e20 carbon atoms/cm$^3$. A thickness of the first carbon-containing layer 24 is not particularly limited, but in embodiments, the second carbon-containing layer 28 has a thickness of from about 5 to about 40 nm, such as from about 5 to about 20 nm.

The doped layer 26 includes a dopant that is different from carbon, and the type of dopant depends upon whether the SSRW 14 is to have p-type doping or n-type doping, which is dependent upon a type of doping in the source region 34, the drain region 36, and the extension regions 38 (which have opposite doping from the SSRW 14). In an embodiment, the doped layer 26 is formed by depositing doped semiconductor material including a p-type dopant over the first carbon-containing layer 24. The semiconductor material may be any of those that are set forth above as suitable for the first semiconductor material. Examples of suitable p-type dopants include Group III elements such as, but not limited to, boron, aluminum, gallium, indium, or a combination thereof. In one specific embodiment, the doped layer 26 includes boron-doped silicon. In another embodiment, the doped layer 26 is formed by depositing doped semiconductor material including an n-type dopant, examples of which including Group V elements such as, but not limited to, arsenic, phosphorus, antimony, or a combination thereof. In one specific embodiment, the doped layer 26 includes phosphorus-doped silicon. In an embodiment and as set forth above, the doped layer 26 is epitaxially formed, and the epitaxial formation may provide for a steep doping gradient and uniform doping that is substantially isolated to the doped layer 26 (with diffusion of the dopant suppressed by the first carbon-containing layer 24 and the second carbon-containing layer 28). The doped layer 26 enables suppression of short channel effects, and high doping content of the doped layer 26, such as about 5e19 dopant atoms/cm$^3$, enables maximized short channel suppression. A thickness of the doped layer 26 is not particularly limited, but in embodiments, the doped layer 26 has a thickness of from about 10 to about 50 nm, such as from about 5 to about 25 nm.

The second carbon-containing layer 28 may be similar to the first carbon-containing layer 24, may have the same thickness, and may include the same carbon-containing semiconductor material and have the same carbon concentration as described above. The second carbon-containing layer 28 overlies the doped layer 26 and, thus, is on an opposite side of the doped layer 26 from the first carbon-containing layer 24. The second carbon-containing layer 28 primarily serves to suppress diffusion of dopant from the doped layer 26 into the intrinsic semiconductor layer 30.

The intrinsic semiconductor layer 30 includes semiconductor material, which may be any of those that are set forth above as suitable for the first semiconductor material. By "intrinsic", it is meant that the intrinsic semiconductor layer 30 is formed with the intention of omitting dopants or other impurities therefrom and is desirably formed from only the semiconductor material, although it is to be appreciated that complete absence of dopants or other impurities is often impossible to achieve. Further, it is to be appreciated that dopants or impurities may diffuse into the intrinsic semiconductor layer 30, and the intrinsic nature of the intrinsic semiconductor layer 30 refers to the substantially pure form of the semiconductor material at the time of formation of the intrinsic semiconductor layer 30. The intrinsic semiconductor layer 30 has a thickness of from about 5 to about 50 nm, such as from about 5 to about 10 nm, and the presence of the intrinsic semiconductor layer 30 contributes to the characterization of the SSRW 14 as such due to the substantial absence of dopant therein (with any dopant present therein resulting from unwanted diffusion from the dopant layer).

Figure 5:
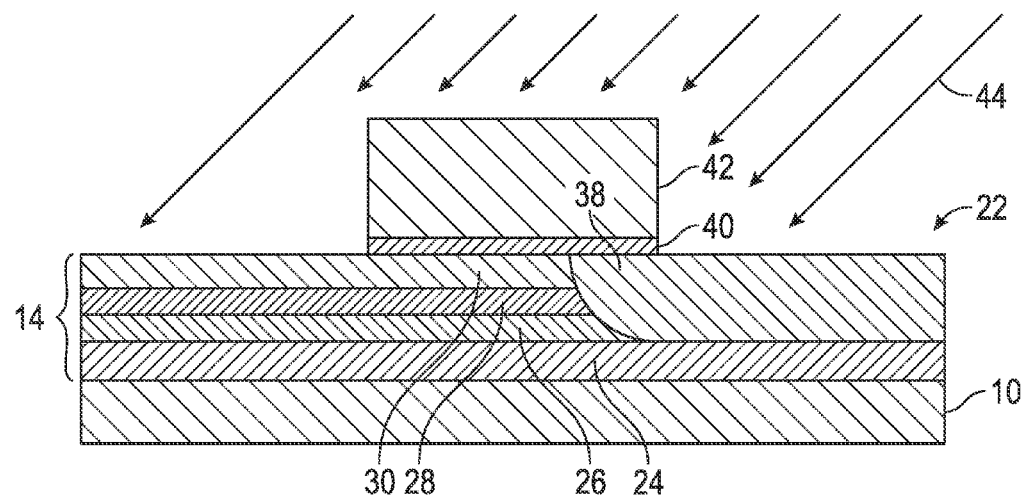
FIG. 5 is a schematic cross-sectional side view of the portion of a semiconductor device of FIG. 4 illustrating formation of an extension region in the semiconductor substrate on one side of the gate electrode and gate dielectric layer.
Figure 6:
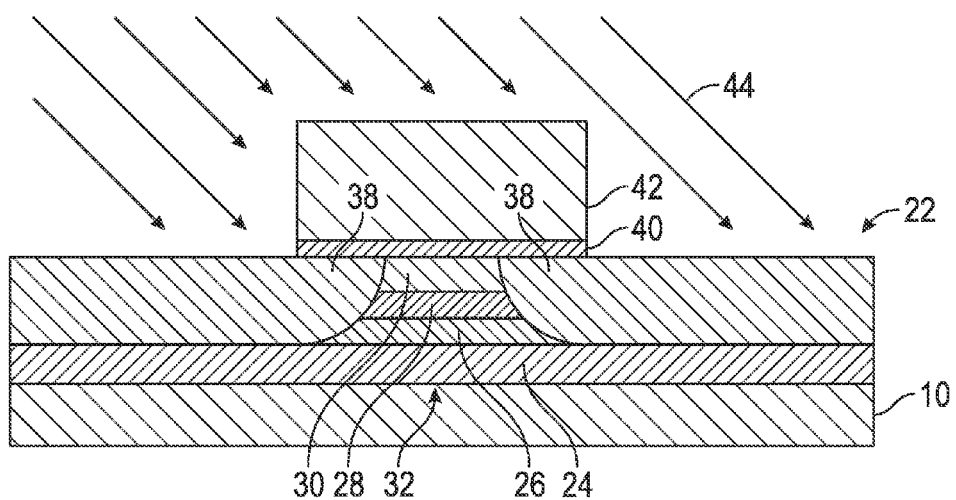
FIG. 6 is a schematic cross-sectional side view of the portion of a semiconductor device of FIG. 5 illustrating formation of another extension region in the semiconductor substrate on an opposite side of the gate electrode and gate dielectric layer from the extension region formed in FIG. 5.
Figure 7:
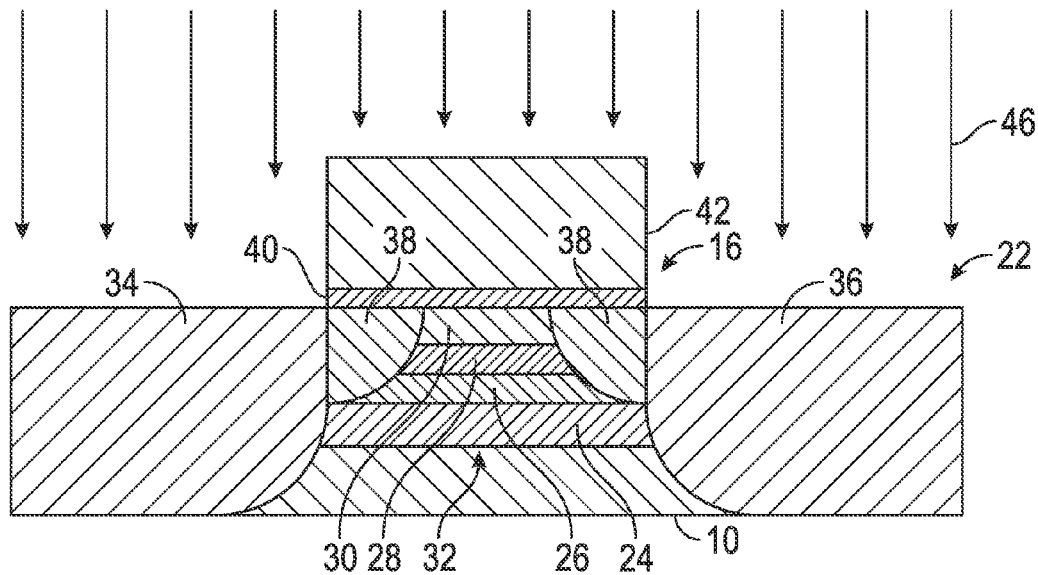
FIG. 7 is a schematic cross-sectional side view of the portion of a semiconductor device of FIG. 6 illustrating formation of a source region and a drain region in the semiconductor substrate on opposite sides of the gate electrode and gate dielectric layer.
Figure 8:
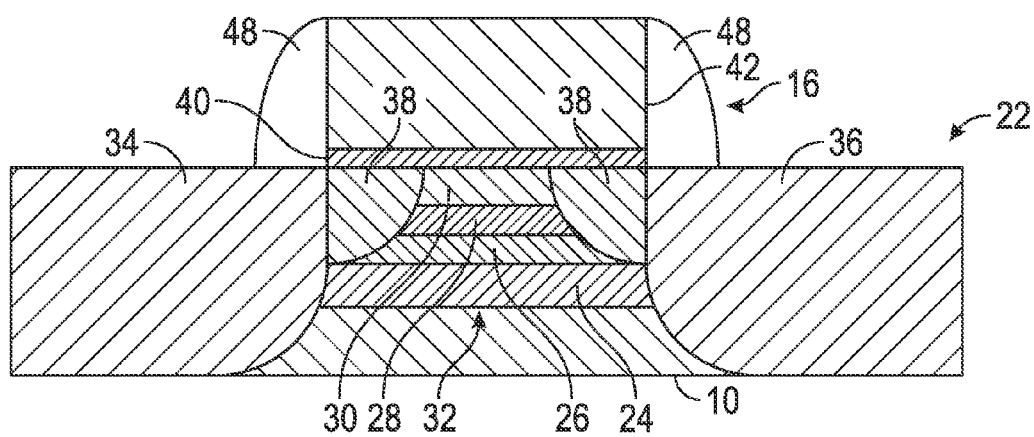
FIG. 8 is a schematic cross-sectional side view of the portion of a semiconductor device of FIG. 7 illustrating formation of sidewall spacers on opposite sides of the gate electrode and gate dielectric layer, overlying the source region and the drain region, respectively.

Referring to FIGS. 4-7, elements of a transistor 16 are formed on the semiconductor substrate 22, with the resulting transistor 16 shown in FIGS. 7 and 8. As shown in FIG. 7, the transistor 16 includes a gate dielectric layer 40 that overlies the intrinsic semiconductor layer 30, a gate electrode 42 overlying the gate dielectric layer 40, and a source region 34 and a drain region 36 disposed in the semiconductor substrate 22. As also shown in FIG. 7, the transistor 16 optionally includes an extension region 38 for each source region 34 and drain region 36. While the particular manner in which the transistor 16 is formed is not limited, at least a portion of the gate dielectric layer 40 overlies the intrinsic semiconductor layer 30. Further, the source region 34, the drain region 36, and/or the extension regions 38 extend up to, and may partially extend into, one or more of the aforementioned layers 24, 26, 28, 30 of the SSRW 14, with the aforementioned layers 24, 26, 28, 30 of the SSRW 14 disposed in the channel region 32 between the source region 34 and the drain region 36. In an embodiment, the extension regions 38 extend in the semiconductor substrate 22 and are in contact with one or more of the aforementioned layers 24, 26, 28, 30 of the SSRW 14. For example, in an embodiment the extension regions 38 are in contact with the first carbon-containing layer 24, and the first carbon-containing layer 24 and second carbon-containing layer 28 suppress interstitial introduction into the channel region 32 that may otherwise occur from high dose ion implantation techniques that are generally employed to form the extension regions 38, in particular.

Figure 4:
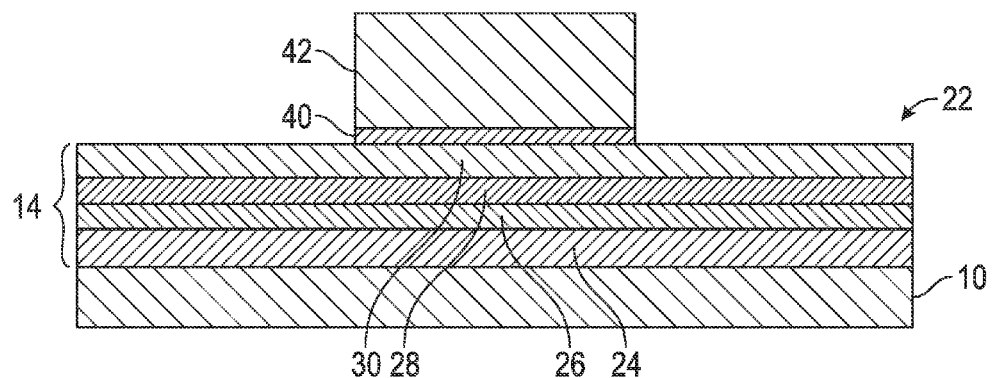
FIG. 4 is a schematic cross-sectional side view of the portion of the semiconductor substrate of FIG. 3 including a gate dielectric layer and a gate electrode formed overlying the intrinsic semiconductor layer to form a semiconductor device.

In an exemplary embodiment for forming the transistor 16 on the semiconductor substrate 22 and as shown in FIG. 4, the gate dielectric layer 40 is formed overlying the intrinsic semiconductor layer 30, followed by forming the gate electrode 42 overlying the gate dielectric layer 40. As described in further detail below, the source region 34 and the drain region 36 are formed in the semiconductor substrate 22 after forming the gate dielectric layer 40 and the gate electrode 42. The gate dielectric layer 40 may include an insulator material such as, but not limited to, silicon dioxide, silicon oxide, silicon nitride, or the like, and may be formed by thermal growing or other deposition techniques. Although FIG. 4 shows the gate dielectric layer 40 formed only on the intrinsic semiconductor layer 30, it is to be appreciated that the gate dielectric layer 40 may be formed over portions of the semiconductor substrate 22 surface outside of the intrinsic semiconductor layer 30. The gate dielectric layer 40 may have a thickness of from about 1 nm to about 10 nm, although the actual thickness can be determined based on the application of the transistor 16 in the semiconductor device being formed. The gate electrode 42 is then formed overlying the gate dielectric layer 40, and may be formed from conventional materials including doped or undoped polycrystalline silicon. Conventional masking or post-deposition etching techniques may then be employed to appropriately shape the gate dielectric layer 40 and gate electrode 42, thereby providing the configuration shown in FIG. 4 for the gate dielectric layer 40 and the gate electrode 42.

In an embodiment and as shown in FIGS. 5 and 6, extension regions 38 for the source region 34 and the drain region 36 are first formed prior to forming the source region 34 and the drain region 36. The extension regions 38 are formed by implanting ions 44, such as ions 44 of either the n-type or p-type depending upon the type of ions 46 in the source region 34 and drain region 36 and the type of dopant in the channel region 32. In particular, the extension regions 38 have the same type of ions 44, i.e., n-type or p-type, as the source region 34 and the drain region 36. In an embodiment, the extension regions 38 are formed through high dose ion implantation of phosphorus ions 44 into the semiconductor substrate 22, with the source region 34 and the drain region 36 being formed by ion implantation of arsenic ions 46. In an embodiment, and as shown in FIGS. 5 and 6, angled ion implantation is employed to implant ions 44 into the semiconductor substrate 22 adjacent the gate electrode 42 and gate dielectric layer 40, thereby enabling ion implantation for a short distance in the semiconductor substrate 22 under the gate dielectric layer 40 and the gate electrode 42. Dual or multi-orientation ion implantation may be employed to form the extension regions 38 for the respective source region 34 and drain region 36 on opposite sides of the gate electrode 42 and gate dielectric layer 40. Conventional masking techniques may be employed to shield areas on the semiconductor substrate 22 where ion implantation is not desired.

In an embodiment and as shown in FIG. 7, the source region 34 and the drain region 36 are then formed after forming the extension regions 38. However, it is to be appreciated that the extension regions 38 are optional, and the transistor 16 may be formed including only the source region 34 and the drain region 36 without the extension regions 38. The source region 34 and the drain region 36 are formed by implanting ions 46, such as ions 46 of either the n-type or p-type depending upon the type of ions 44 in the extension region 38 and in the channel region 32. In particular, the source region 34 and the drain region 36 have the same type of ions 46, i.e., n-type or p-type, as the extension regions 38, although the specific type of ions 46 is often different in the source region 34 and the drain region 36 than in the extension regions 38. In an embodiment, the source region 34 and the drain region 36 are formed through high dose ion implantation of arsenic ions 46 into the semiconductor substrate 22. The source region 34 and the drain region 36 are deeper than the extension regions 38, which facilitate later formation of contacts to those regions, and are spaced farther away from the gate electrode 42. In an embodiment and as shown in FIG. 7, the source region 34 and the drain region 36 may be self-aligned to the gate electrode 42. However, it is to be appreciated that in other embodiments, sidewall spacers (not shown as being present during ion implantation) may be employed to align the source region 34 and the drain region 36 relative to the gate electrode 42 with desired spacing therefrom. Again, conventional masking techniques may be employed to shield areas on the semiconductor substrate 22 where ion implantation is not desired.

In an embodiment and as shown in FIG. 8, sidewall spacers 48 are formed on opposing sides of the gate electrode 42, and the respective sidewall spacers 48 overlie the source region 34 and the drain region 36. In this embodiment, the sidewall spacers 48 may be provided to insulate the gate electrode 42 from subsequently formed electrical contacts (not shown) that connect to the source region 34 and the drain region 36. However, it is to be appreciated that in other embodiments and as alluded to above, the sidewall spacers 48 may be formed prior to forming the source region 34 and the drain region 36 to selectively mask the semiconductor substrate 22 and align ion implantation into desired areas of the semiconductor substrate 22. The sidewall spacers 48 may be formed through conventional techniques. For example, in an embodiment and although not shown, a sidewall spacer layer (not shown) that includes a dielectric material such as, for example, a silicon nitride or a silicon oxide, is conformally blanket-deposited overlying the surface of the semiconductor wafer 10 and the gate electrode 42 using, for example, a plasma enhanced chemical vapor deposition (PECVD), low pressure chemical vapor deposition (LPCVD), or chemical vapor deposition (CVD) process. The sidewall spacer layer may be anisotropically etched to form the sidewall spacers 48 adjacent to the sidewalls of the gate electrode 42 and gate dielectric layer 40, as illustrated in FIG. 8.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A semiconductor device comprising:
   a semiconductor substrate;
   a source region and a drain region disposed in the semiconductor substrate, wherein a channel region is defined in the semiconductor substrate between the source region and the drain region;
   a gate dielectric layer overlying the channel region of the semiconductor substrate;
   a gate electrode overlying the gate dielectric layer;

an extension region disposed adjacent each source region and drain region in the semiconductor substrate, wherein the extension regions extend toward the channel region from the respective source region and the drain region and under a portion of the gate electrode;

wherein a super steep retrograde well (SSRW) configuration is formed in the channel region with the channel region comprising a first carbon-containing layer, a doped layer overlying the first carbon-containing layer, a second carbon-containing layer overlying the doped layer, and an intrinsic semiconductor layer overlying the second carbon-containing layer; and wherein the extension regions are in contact with the first carbon-containing layer.

2. The semiconductor device of claim 1, wherein the doped layer in the channel region comprises a Group III element.

3. The semiconductor device of claim 2, wherein the source region and the drain region comprise a Group V element.

4. The semiconductor device of claim 3, wherein:
the doped layer comprises boron-doped silicon; and
the source region and the drain region comprise arsenic-doped silicon.

5. The semiconductor device of claim 1, wherein at least one of the first carbon-containing layer, the doped layer, the second carbon-containing layer, or the intrinsic semiconductor layer is further defined as an epitaxially-grown layer.

6. The semiconductor device of claim 1, wherein the doped layer is directly disposed on the first carbon-containing layer, the second carbon-containing layer is disposed directly on the doped layer, and the intrinsic semiconductor layer is disposed directly on the second carbon-containing layer.

7. A semiconductor device comprising:
a semiconductor substrate;
a source region and a drain region disposed in the semiconductor substrate, wherein a channel region is defined in the semiconductor substrate between the source region and the drain region;
a gate dielectric layer overlying the channel region of the semiconductor substrate;
a gate electrode overlying the gate dielectric layer;
an extension region disposed adjacent each source region and drain region in the semiconductor substrate, the extension regions extending toward the channel region from the respective source region and the drain region and under a portion of the gate electrode;
wherein a super steep retrograde well (SSRW) configuration is formed in the channel region with the channel region comprising a first carbon-containing layer, a doped layer disposed directly on the first carbon-containing layer, a second carbon-containing layer directly disposed on the doped layer, and an intrinsic semiconductor layer directly disposed on the second carbon-containing layer, and wherein at least one of the first carbon-containing layer, the doped layer, the second carbon-containing layer, or the intrinsic semiconductor layer is further defined as an epitaxially-grown layer;

wherein the extension regions are in contact with the first carbon-containing layer.

8. A method of forming a semiconductor device, the method comprising:
providing a semiconductor wafer comprising a first semiconductor material;
forming a channel region having a super steep retrograde well (SSRW) configuration including:
forming a first carbon-containing layer over a surface of the semiconductor wafer;
forming a doped layer overlying the first carbon-containing layer;
forming a second carbon-containing layer overlying the doped layer; and
forming an intrinsic semiconductor layer overlying the second carbon-containing layer to produce a semiconductor substrate;
forming a transistor on the semiconductor substrate, wherein the transistor comprises a gate dielectric layer overlying the intrinsic semiconductor layer, a gate electrode overlying the gate dielectric layer, and a source region and a drain region disposed in the semiconductor substrate;
wherein forming the transistor further comprises forming an extension region for each source region and drain region prior to forming the source region and the drain region, wherein the extension regions extend in the semiconductor substrate under a portion of the gate electrode with the extension regions in contact with the first carbon-containing layer.

9. The method of claim 8, wherein at least one of forming the first carbon-containing layer, forming the doped layer, forming the second carbon-containing layer, or forming the intrinsic semiconductor layer comprises epitaxially forming the respective layer.

10. The method of claim 8, wherein forming the transistor comprises forming the gate dielectric layer overlying the intrinsic semiconductor layer, forming the gate electrode overlying the gate dielectric layer, and thereafter, forming the source region and the drain region in the semiconductor substrate.

11. The method of claim 8, wherein forming the first carbon-containing layer, forming the doped layer, forming the second carbon-containing layer, and forming the intrinsic semiconductor layer comprise forming the doped layer directly disposed on the first carbon-containing layer, forming the second carbon-containing layer disposed directly on the doped layer, and forming the intrinsic semiconductor layer disposed directly on the second carbon-containing layer.

* * * * *